(12) United States Patent
Ishikawa

(10) Patent No.: US 6,420,662 B1
(45) Date of Patent: Jul. 16, 2002

(54) WIRING BOARD

(75) Inventor: Kazuhiro Ishikawa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/460,244

(22) Filed: Dec. 13, 1999

(30) Foreign Application Priority Data

Mar. 11, 1999 (JP) .......................................... 11-064207

(51) Int. Cl.$^7$ .......................... H05K 1/11; H01R 12/04
(52) U.S. Cl. .................. 174/261; 174/117 F; 361/778; 361/803; 428/213
(58) Field of Search ................................. 361/792, 793, 361/794, 795, 796, 777, 778, 780, 803; 174/261, 117 F, 117 FF; 428/213

(56) References Cited

U.S. PATENT DOCUMENTS

| | | | | |
|---|---|---|---|---|
| 4,045,750 A | * | 8/1977 | Marshall | 333/6 |
| 4,426,548 A | * | 1/1984 | Oritsuki et al. | 174/72 R |
| 4,845,315 A | * | 7/1989 | Stopper | 361/428 |
| 4,869,671 A | * | 9/1989 | Pressley et al. | 439/55 |
| 4,954,929 A | * | 9/1990 | Baran | 361/414 |
| 5,416,274 A | * | 5/1995 | Ushiyama | 174/250 |
| 5,529,829 A | * | 6/1996 | Koskenmaki et al. | 428/167 |
| 5,541,369 A | * | 7/1996 | Tahara et al. | 174/268 |

FOREIGN PATENT DOCUMENTS

| JP | 62-155586 A | 7/1987 |
|---|---|---|
| JP | 4-188886 A | 7/1992 |

* cited by examiner

Primary Examiner—Kamand Cuneo
Assistant Examiner—Jose H. Alcala
(74) Attorney, Agent, or Firm—Nixon & Vanderhye P.C.

(57) ABSTRACT

A power source (ground) line, which would have been formed with a broad conducting path is divided into multiple fine-line interconnections. A short-circuiting joint is formed to connect between the divided, multiple fine-line interconnections.

6 Claims, 3 Drawing Sheets

WIRING BOARD

BACKGROUND OF THE INVENTION (1) Field of the Invention

The present invention relates to a wiring board such as a printed wiring board etc., and in particular relates to a wiring pattern which alleviates board's warping due to thermal expansion.

(2) Description of the Prior Art

A printed wiring board is composed of an electrical insulating substrate (e.g., glass-epoxy baseboard) and a wiring pattern of interconnections of copper as a conductor on the surface thereof or in an inner layer thereof. The wiring pattern may be formed on one or both sides of the board. Now, referring to FIG. 1, a double-sided wiring board having a pattern of interconnections on both sides of the substrate will be described as the prior art.

In order to lower the conductor's resistance, a solid wiring pattern of interconnections for power source lines and/or ground (GND) lines 41 which have much greater widths compared to other typical signal lines is mainly formed on one side of a glass-epoxy baseboard 40 in the lateral direction (the direction parallel to the document surface). On the opposite side, typical signal lines 42 which need less current-carrying capacity are formed mainly in the longitudinal direction (the direction perpendicular to the document). Though the figure sectionally shows a power source (ground) line 41 laid out in the longitudinal direction in order to represent the fact that power source (ground) line 41 is wider than signal lines 42 on the opposite side, a power source (ground) line 41 is generally formed in the lateral direction. Here, it is understood that the relationship of the orientations of the above interconnections may be reversed.

When ICs and/or other electric components are mounted on such a printed wiring board, the board is thermally treated by reflow soldering etc. (at 200 to 260° C.). As a result, warping occurs in the board due to difference in thermal expansion coefficient between the insulating substrate and wiring pattern (conductor), causing terminal floating (of the electric components), solder cracking and the like. This phenomenon is more likely to arise as the board becomes thinner. Also, when a broad solid conducting pattern such as a power source line, ground line, etc., is formed on one side only, the phenomenon more often occurs, greatly contributing to mounting failures.

For countermeasures against these problems, there have been disclosed Japanese Patent Application Laid-Open Hei 4 No.188886, Japanese Patent Application Laid-Open Sho 62 No.155586. In the former case, a wiring pattern of interconnections is formed on one side of an insulating substrate while a dummy pattern having interconnections arranged in the same direction as above is formed on the other side so as to prevent the board from warping due to difference in thermal expansion coefficient. In the latter case, a solid conductor pattern having an area greater than 50% of the total board area is formed on the undersurface of the insulating substrate while a wiring pattern having conducting paths of large widths or island-like conductor pads is formed on the obverse surface of the insulating substrate, directly opposite the solid conductor pattern, whereby warping of the board is prevented. Both of these countermeasures attempt to make the areas of copper foil on both sides of the insulating substrate as equal to each other as possible to reduce warping attributed to difference in thermal expansion coefficient between the copper wiring and the insulating substrate.

However, in a method as above, it is necessary to align the directions of thermal expansion of, and equal the areas of, the conductor patterns on both sides of the insulating substrate. So this will restrict the conductor pattern formed on the undersurface of the insulating substrate. As a result, if there is no margin to meet these restrictions, it is impossible to use the method.

SUMMARY OF THE INVENTION

The present invention has been devised in view of the above problems in the prior art, and it is therefore an object of the present invention to provide a wiring board which can be prevented from warping due to difference in thermal expansion with a markedly simple configuration.

In order to achieve the above object, the present invention is configured as follows:

In accordance with the first aspect of the present invention, a wiring board for mounting and connection of electric components comprises: an insulating substrate; and a wiring pattern of conducting paths formed on at least one side of the insulating substrate, and is characterized in that, among the conducting paths formed on the insulating substrate, all or part thereof which needs a predetermined current-carrying capacity and hence would have been formed with broad conducting paths is divided into multiple fine-line interconnections.

In accordance with the second aspect of the present invention, the wiring board having the above first feature is characterized in that a short-circuiting joint is formed to electrically join the divided, multiple fine-line interconnections.

In accordance with the third aspect of the present invention, a wiring board for mounting and connection of electric components comprises: an insulating substrate; and a wiring pattern of conducting paths formed on at least one side of the insulating substrate, and is characterized in that, among the conducting paths formed on the insulating substrate, all or part thereof which needs a predetermined current-carrying capacity and hence would have been formed with broad conducting paths is formed in a cranked configuration.

In accordance with the fourth aspect of the present invention, a wiring board for mounting and connection of electric components comprises: an insulating substrate; and a wiring pattern of conducting paths formed on at least one side of the insulating substrate, and is characterized in that, among the conducting paths formed on the insulating substrate, all or part thereof which needs a predetermined current-carrying capacity and would have been formed with broad conducting paths is divided into multiple fine-line interconnections and all or part of the divided multiple fine-line interconnections is arranged in a cranked configuration.

In accordance with the fifth aspect of the present invention, the wiring board having the above fourth feature is characterized in that a short-circuiting joint is formed to electrically join the divided, cranked, multiple fine-line interconnections.

In accordance with the sixth aspect of the present invention, the wiring board having any one of the above first, second, third, fourth and fifth features is characterized in that conducting paths needing a predetermined current-carrying amount are of a power source line or of a ground line.

According to the wiring board of the present invention, since whole or part of the power source lines or ground lines etc., conventionally needing broad conducting paths, is divided into a pattern with multiple fine-line interconnections, it is possible to reduce the stress arising due to difference in thermal expansion coefficient, and hence reduce the warping of the board due to difference in thermal expansion coefficient between the insulating substrate and the wiring pattern. Accordingly, it is possible to prevent terminal floating and/or solder cracking which would be caused by warping of the board, and hence eliminate connection (mounting) failures.

Further, according to the wiring board of the present invention, since whole or part of power source lines or ground lines, etc., conventionally needing broad conducting paths, is formed in a cranked configuration, it is possible to break up or offset the stress due to difference in thermal expansion coefficient, and hence reduce the warping of the board due to difference in thermal expansion coefficient between the insulating substrate and the wiring pattern. Accordingly, it is possible to prevent terminal floating and/or solder cracking which would be caused by warping of the board, thus making it possible to eliminate connection (mounting) failures.

DESCRIPTION OF THE PREFERRED EMBODIMENTS

The embodiment of the present invention will hereinafter be described in detail with reference to the accompanying drawings.

Figure 1:
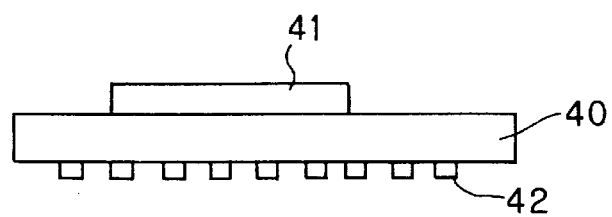
FIG. 1 is a sectional view showing a configuration of a conventional double-sided wiring board.
Figure 2:
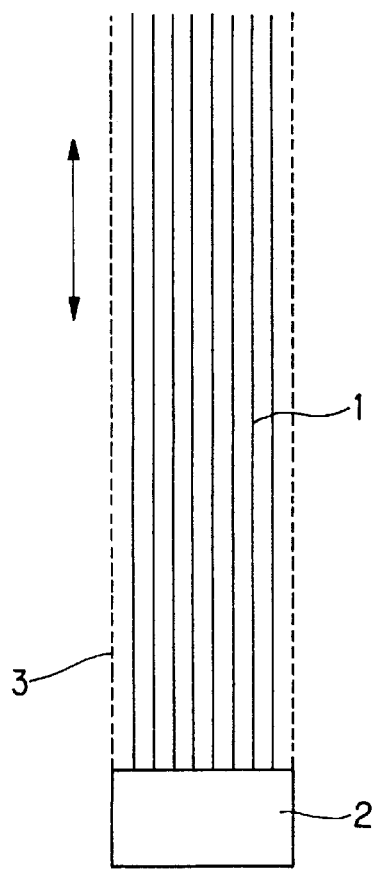
FIG. 2 is a plan view showing a wiring pattern of a power source (ground) line in a double-sided wiring board in accordance with the first embodiment of the present invention.

FIG. 2 is a plan view showing a wiring pattern of a power source (ground) line formed on the obverse side in a double-sided wiring board in accordance with the first embodiment of the present invention. The double-sided wiring board of this embodiment is formed of a glass-epoxy baseboard (of 0.5 mm thick) and copper foil of 30 $\mu$m thick as the interconnecting conductor. Power source lines and ground lines which need large current-carrying capacity are formed on the obverse side of the board, for example, in the lateral direction while signal lines which need little current-carrying capacity are formed on the undersurface, for example, in the longitudinal direction. FIG. 2 only shows the wiring pattern of a power source (ground) line.

As illustrated, the power source (ground) line, which was formed of a broad path of conductor in the conventional configuration, is divided into multiple fine-line interconnections 1, ..., 1. Designated at 2 is a short-circuiting joint for joining multiply divided, fine-line interconnections 1, ..., 1, thus formed as above and this short-circuiting joint is composed of the same material as fine-line interconnections 1. The broken lines designated at reference numeral 3 in the figure show the conventional wiring pattern of a power source (ground) line of a broad path for comparison with the power source (ground) line in this embodiment. In this embodiment, multiple fine-line interconnections 1, ..., 1 and short-circuiting joints 2 are formed at the same time by etching with a modified etching pattern in the same step as when power source (ground) lines of a broad path are conventionally formed by etching copper foil. This short-circuiting joint 2 may be formed at one site or at multiple locations, as appropriate along the power source (ground) line. The number of the fine-line interconnections and their line width and the interval between fine-line interconnections are set appropriately, taking into account the thermal expansion coefficients of the insulating substrate and the wiring pattern, the temperature during the heat treatment and other conditions.

The above short-circuiting joint 2 is not essential, but provision of this produces the effect of reducing the total resistance of the wiring pattern as well as producing the effect of reducing the increase of the resistance value if the fine-line interconnections are partially disconnected. Naturally, these effects become more conspicuous as short-circuiting joints 2 are increased in number.

In accordance with the printed wiring board of this embodiment, a power source (ground) line is formed of divided, multiple fine-line interconnections 1, ..., 1 and one or more short-circuiting joints 2, instead of a broad, solid conducting path in the conventional configuration. Therefore, it is possible to reduce the stress arising in the wiring pattern which would causes the wiring pattern to expand in the direction of wiring (the direction of the arrow in the figure), compared to the conventional case of the solid pattern shown by broken lines 3, and hence it is possible to reduce warping of the board due to difference in thermal expansion coefficient between the insulating substrate (glass-epoxy baseboard) and the interconnections (copper foil). As a result, the occurrences of terminal floating and/or solder cracking, which would be caused by warping of the board, can be reduced, thus making it possible to reduce or eliminate connection (mounting) failures of electric components (ICs etc.). Further, since the wiring pattern is formed of fine-line interconnections, if part of the fine-line interconnections cracked or became disconnected, this would have less influence on the increase of the total resistance of the wiring pattern.

It should be understood that the entire power source (ground) line may be formed of multiple fine-line interconnections as shown in FIG. 2 or multiple fine-line interconnections connected at predetermined number of sites by short-circuiting joints. Alternatively, by taking into account the layout of signal lines etc. on the opposite side of the baseboard, the configuration of the present invention may be adopted partially only for the needed part of power source (ground) lines while conventional, broad, solid conducting paths may be used for the remainder in order to suppress the increase in wiring resistance.

Thus, the description of the first embodiment of the present invention is complete.

Next, the second embodiment of the present invention will be described.

Figure 3:
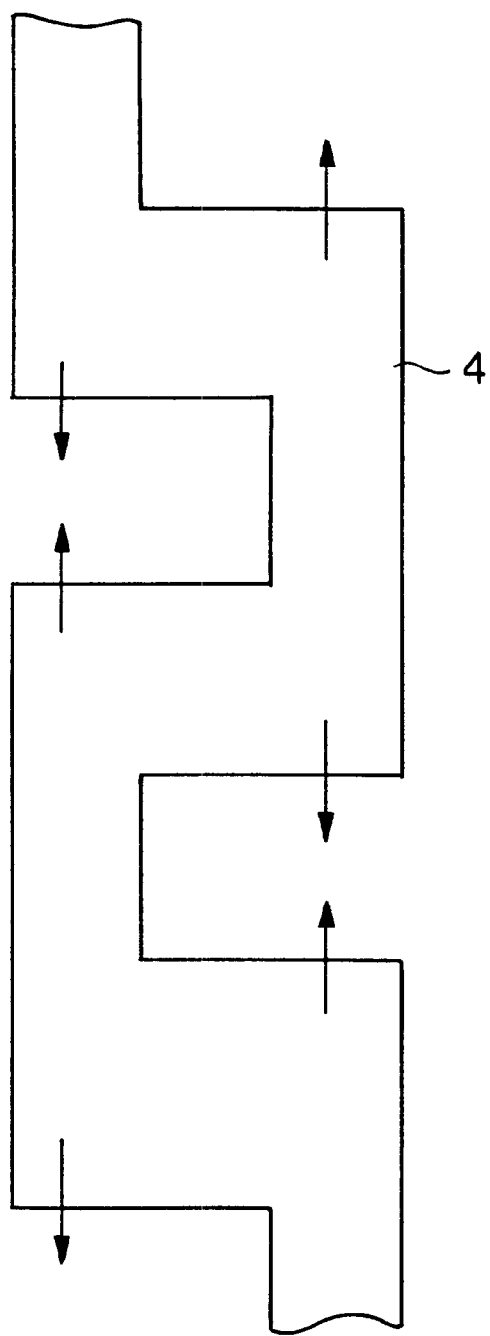
FIG. 3 is a plan view showing a wiring pattern of a power source (ground) line in a double-sided wiring board in accordance with the second embodiment of the present invention.

FIG. 3 is a plan view showing a wiring pattern of a power source (ground) line formed on the obverse side in a double-sided wiring board in accordance with the second embodiment of the present invention. Similarly to the first embodiment, the double-sided wiring board in this embodiment is also formed of a glass-epoxy baseboard (of 0.5 mm thick) as an insulating substrate and copper foil of 30 μm thick as the interconnection conductor. Power source lines and ground lines which need large current-carrying capacity are formed on the obverse side of the board while signal lines which need little current-carrying capacity are formed on the undersurface. FIG. 3 only shows the wiring pattern of a power source (ground) line.

As illustrated, a power source (ground) line, which would have been formed linearly with a broad conducting path, is formed with a conducting path of a cranked configuration 4 and with half the width of the conventional one. In this embodiment, cranked configuration 4 of the conducting paths is formed by etching with a modified etching pattern in the same step as when power source (ground) lines of a linear, broad conducting path are formed by etching copper foil.

In accordance with the printed wiring board of this embodiment, a power source (ground) line is formed with a cranked configuration 4, instead of a linear pattern of conductor in the conventional configuration. Therefore, it is possible to break up or offset the stress arising in the wiring pattern which would cause the wiring pattern to expand in the direction of wiring (the direction of the arrow in the figure), compared to the conventional case of the linear pattern. So it is possible to reduce the stress due to thermal expansion upon the entire board and hence warping of the board attributed to the difference in thermal expansion coefficient between the insulating substrate (glass-epoxy baseboard) and the interconnections (copper foil). As a result, the occurrences of terminal floating and/or solder cracking, which would be caused by warping of the baseboard, can be reduced, thus making it possible to reduce or eliminate connection (mounting) failures of electric components (ICs etc.).

It should be understood that the entire power source (ground) line may be configured of cranked configuration 4 shown in FIG. 3. Alternatively, by taking into account the layout of signal lines etc. on the opposite side of the baseboard, the configuration of the present invention may be adopted partially only for the needed part of the power source (ground) line while a conventional linear pattern may be used for the remainder.

Thus, the description of the second embodiment of the present invention is complete.

Next, the third embodiment of the present invention will be described.

Figure 4:
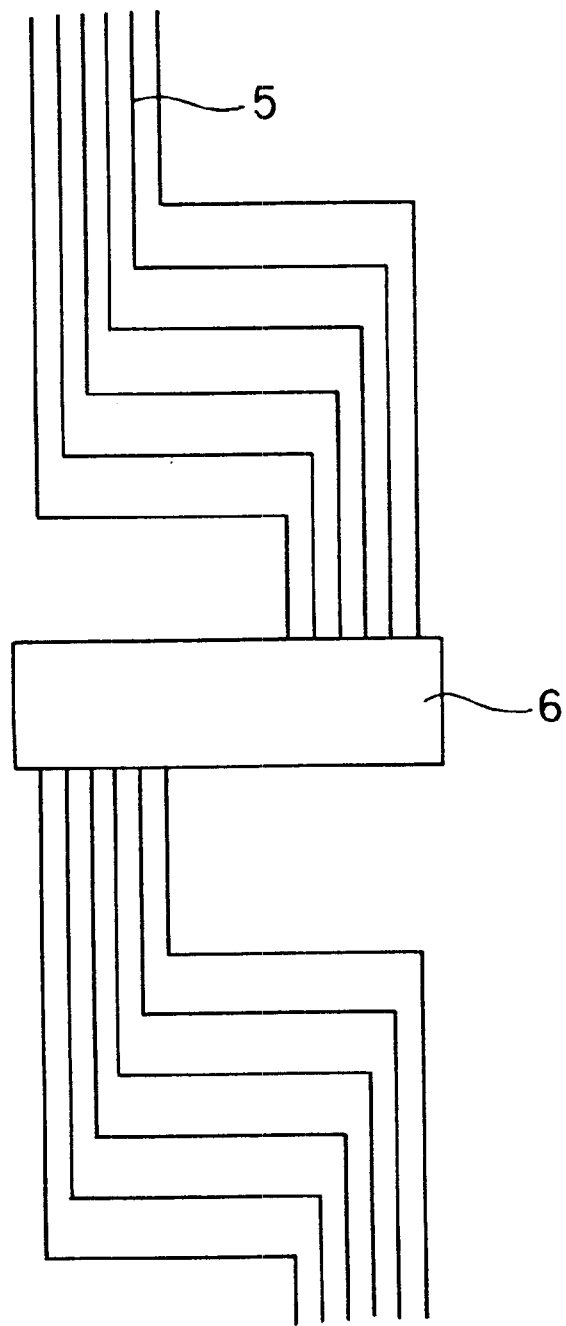
FIG. 4 is a plan view showing a wiring pattern of a power source (ground) line in a double-sided wiring board in accordance with the third embodiment of the present invention.

FIG. 4 is a plan view showing a wiring pattern of a power source (ground) line formed on the obverse side in a double-sided wiring board in accordance with the third embodiment of the present invention. Similarly to the first and second embodiments, the double-sided wiring board in this embodiment is also formed of a glass-epoxy baseboard (of 0.5 mm thick) as an insulating substrate and copper foil of 30 μm thick as the interconnection conductor. Power source lines and ground lines which need large current-carrying capacity are formed on the obverse side of the board while signal lines which need little current-carrying capacity is formed on the undersurface. FIG. 4 only shows the wiring pattern of a power source (ground) line.

As illustrated, this embodiment is a combination of the configuration of the first embodiment and that of the second, and the effect and superiority of this configuration was confirmed experimentally. That is, a power source (ground) line, which normally would have been formed linearly with a broad conducting path, is formed with multiply divided, fine-line interconnections 5, . . . , 5, laid out in a cranked configuration. Designated at 6 is a short-circuiting joint for joining multiple fine-line interconnections 5, . . . , 5, thus divided as above and this short-circuiting joint is composed of the same material as fine-line interconnections 5 . . . , 5. In this embodiment, cranked, multiple fine-line interconnections 5, . . . , 5 and short-circuiting joint 6 are formed at the same time by etching with a modified etching pattern in the same step as when power source (ground) lines of a linear, broad conducting path are conventionally formed by etching copper foil. This short-circuiting joint 6 may be formed at one site or at multiple locations, as appropriate along the power source (ground) line. The number of the cranked, fine-line interconnections and their conductor width and the interval between fine-line interconnections are set appropriately taking into account the thermal expansion coefficients of the insulating substrate and the wiring pattern, the temperature during the heat treatment and other conditions.

The above short-circuiting joint 6 is not essential, but provision of this produces the effect of reducing the total resistance of the wiring pattern as well as producing the effect of reducing the increase of the resistance value if the fine-line interconnections are partially disconnected. These effects become more conspicuous as the short-circuiting joints are increased in number.

In accordance with the printed wiring board of this embodiment, a power source (ground) line is formed of multiply, divided, cranked fine-line interconnections 5, . . . , 5, or multiply, divided, cranked fine-line interconnections 5, . . . , 5 and one or more short-circuiting joints 6, instead of a linear, broad, solid conducting path in the conventional configuration. Therefore, it is possible to reduce the stress arising in the wiring pattern which would cause the wiring pattern to expand in the direction of wiring (the direction of the arrow in the figure), and hence, it is possible to break up or offset the stress. So, it is possible to reduce warping of the board due to difference in thermal expansion coefficient between the insulating substrate (glass-epoxy baseboard) and the interconnections (copper foil). As a result, the occurrences of terminal floating and/or solder cracking, which would be caused by warping of the baseboard, can be reduced, thus making it possible to reduce or eliminate connection (mounting) failures of electric components (ICs etc.). Further, since the wiring pattern is formed of cranked, multiple fine-line interconnections, if part of the fine-line interconnections cracked or became disconnected, this will produce less influence on the increase of the total resistance of the wiring pattern.

It should be understood that the entire power source (ground) line may be formed of cranked, multiple fine-line interconnections as shown in FIG. 4 or cranked, multiple fine-line interconnections connected at predetermined number of sites by short-circuiting joints. Alternatively, by taking into account the layout of signal lines etc. on the opposite side of the baseboard, the configuration of the present invention may be adopted partially only for the needed part of the power source (ground) line while conventional, linear, solid conducting paths may be used for the remainder in order to suppress the increase in wiring resistance.

Thus, the description of the third embodiment of the present invention is complete.

The above embodiments are all applied to a double-sided wiring board. However, the present invention should not be limited to a double-sided wiring board. That is, the present invention can be effectively applied to a single-sided wiring board. Further, the present invention is not limited to a board such as a single-layered wiring board having a single layer of interconnections and can be applied to a multi-layered wiring board in which multiple layers of interconnections are formed. In the case of a multi-layered wiring board, the present invention is most effective when it is applied to the outermost layers of interconnections. However, the present invention may also be applied to an inner layer of interconnections if it is a layer located away from the center of the thickness of the board.

As detailed heretofore, in accordance with the present invention, it is possible to provide a wiring board which is markedly effective in reducing or preventing warping of the board as well as mounting failures of electric components without any constraints upon the wiring pattern on the undersurface.

Further, the present invention is not limited to printed wiring boards, but can be applied to other types of wiring boards.

Wiring or interconnections to, which the present invention is applied should not be limited to power source lines and ground lines. That is, the present invention can produce the same effects on other wiring or interconnections which need a relatively large current-carrying capacity and hence conventionally need a broad configuration.

What is claimed is:

1. A wiring board for mounting and connection of electric components, comprising
   an insulating substrate;
   a wiring pattern formed on at least one side of the insulating substrate,
      wherein said wiring pattern has a predetermined current-carrying capacity and is divided into multiple spaced apart immediately adjacent fine-line interconnections which are electrically connected to one another via a short circuiting joint, so that no other circuit patterns are provided between adjacent ones of said immediately adjacent fine-line interconnections.

2. The wiring board according to claim 1, wherein said short-circuiting joint is formed to electrically join the divided, immediately adjacent multiple fine-line interconnections.

3. A wiring board for mounting and connection of electric components, comprising:
   an insulating substrate;
   a wring pattern formed on at least one side of the insulating substrate,
      wherein said wiring pattern has a predetermined current-carrying capacity and is formed in a cranked configuration in order to reduce stress in a direction of the wiring pattern, said cranked configuration defining a string of electrically interconnected approximately U-shaped portions of said pattern, wherein adjacent ones of said approximately U-shaped portions face opposite directions.

4. A wiring board for mounting and connection of electric components, comprising:
   an insulating substrate;
   a wiring pattern formed on at least one side of the insulating substrate,
      wherein said wiring pattern has a predetermined current-carrying capacity and is divided into multiple immediately adjacent spaced apart fine-line electrically connected interconnections and all or part of the divided spaced apart multiple fine-line interconnections are arranged in a cranked configuration in order to reduce stress in a direction of the wiring pattern, said cranked configuration defining a string of electrically interconnected U-shaped portions of said pattern, wherein adjacent ones of said U-shaped portions face opposite directions.

5. The wiring board according to claim 4, wherein a short-circuiting joint is formed to electrically join the divided, cranked, multiple fine-line interconnections.

6. The wiring board according to claim 1, wherein conducting paths having a predetermined amount of current-carrying are a power source line or a ground line.

* * * * *